(12) United States Patent
Lee et al.

(10) Patent No.: US 10,992,893 B2
(45) Date of Patent: Apr. 27, 2021

(54) METHOD AND SYSTEM FOR GENERATING A RAMPING SIGNAL

(71) Applicant: CISTA SYSTEM CORP., Grand Cayman (KY)

(72) Inventors: Dennis Tunglin Lee, San Jose, CA (US); Guangbin Zhang, Cupertino, CA (US)

(73) Assignee: Cista System Corp., Grand Cayman (KY)

( * ) Notice: Subject to any disclaimer, the term of this patent is extended or adjusted under 35 U.S.C. 154(b) by 0 days.

(21) Appl. No.: 16/527,661

(22) Filed: Jul. 31, 2019

(65) Prior Publication Data

US 2019/0356876 A1 Nov. 21, 2019

Related U.S. Application Data

(63) Continuation of application No. 15/865,326, filed on Jan. 9, 2018, now Pat. No. 10,440,303, which is a
(Continued)

(51) Int. Cl.
*H03K 4/02* (2006.01)
*H04N 5/376* (2011.01)
(Continued)

(52) U.S. Cl.
CPC ............. *H04N 5/3765* (2013.01); *H03K 4/02* (2013.01); *H03K 4/08* (2013.01); *H03K 4/12* (2013.01);
(Continued)

(58) Field of Classification Search
CPC .... H04N 5/3765; H04N 5/378; H04N 5/3655; H04N 5/3658; H03K 4/48; H03K 4/08; H03K 4/12; H03K 4/26; H03K 4/02
(Continued)

(56) References Cited

U.S. PATENT DOCUMENTS 5,323,157 A * 6/1994 Ledzius ................ H03M 3/504
341/136
5,579,004 A * 11/1996 Linz ........................ G06F 7/026
341/144
(Continued)

FOREIGN PATENT DOCUMENTS

CN 101179272 A 5/2008
CN 101236444 A 8/2008

OTHER PUBLICATIONS

Non-Final Office Action dated Aug. 29, 2016, issued in related U.S. Appl. No. 14/560,371 (10 pages).
(Continued)

*Primary Examiner* — Ryan Jager
(74) *Attorney, Agent, or Firm* — Sheppard Mullin Richter & Hampton LLP

(57) ABSTRACT

A system is provided for generating a ramping signal. The system includes a plurality of storage circuits each including an input and an output. The output of a previous storage circuit is connected to the input of a next storage circuit. The storage circuits are configured to propagate a first enable signal based on a first control signal. The system also includes a plurality of first current generating circuits. Each first current generating circuit is coupled to the output of a corresponding storage circuit to receive the propagated first enable signal. The first current generating circuits are configured to generate a first current signal based on the propagated first enable signal.

20 Claims, 11 Drawing Sheets

Related U.S. Application Data continuation of application No. 15/410,498, filed on Jan. 19, 2017, now Pat. No. 9,894,307, which is a continuation of application No. 14/560,371, filed on Dec. 4, 2014, now Pat. No. 9,584,102.

(60) Provisional application No. 61/915,444, filed on Dec. 12, 2013.

(51) Int. Cl.

| | | |
|---|---|---|
| *H04N 5/378* | (2011.01) | |
| *H03K 4/08* | (2006.01) | |
| *H03K 4/12* | (2006.01) | |
| *H03K 4/26* | (2006.01) | |
| *H03K 4/48* | (2006.01) | |
| *H04N 5/365* | (2011.01) | |

(52) U.S. Cl.
CPC .............. *H03K 4/26* (2013.01); *H03K 4/48* (2013.01); *H04N 5/378* (2013.01); *H04N 5/3655* (2013.01); *H04N 5/3658* (2013.01)

(58) Field of Classification Search
USPC .......................................................... 327/126
See application file for complete search history.

(56) References Cited

U.S. PATENT DOCUMENTS

| | | | | |
|---|---|---|---|---|
| 5,585,802 | A * | 12/1996 | Cabler | ................ G10H 1/0066 341/143 |
| 6,542,100 | B1 * | 4/2003 | Matter | .................. H03H 17/02 324/366 |
| 6,864,726 | B2 * | 3/2005 | Levin | .................. H03K 17/165 327/104 |
| 7,528,754 | B1 | 5/2009 | Bakkaloglu et al. | |
| 7,705,758 | B2 * | 4/2010 | Tu | ......................... H03M 3/504 341/143 |
| 7,795,942 | B2 * | 9/2010 | Quan | ....................... G05F 3/16 327/261 |
| 8,514,012 | B2 | 8/2013 | Splithof et al. | |
| 9,584,102 | B2 * | 2/2017 | Lee | ...................... H03K 4/26 |
| 9,894,307 | B2 * | 2/2018 | Lee | ...................... H04N 5/378 |
| 10,440,303 | B2 * | 10/2019 | Lee | ...................... H03K 4/08 |
| 2003/0071666 | A1 | 4/2003 | Bailey | |
| 2004/0257127 | A1 | 12/2004 | Levin et al. | |
| 2005/0206414 | A1 | 9/2005 | Cottin et al. | |
| 2011/0279723 | A1 * | 11/2011 | Takamiya | ............ H04N 5/3745 348/308 |
| 2016/0062430 | A1 * | 3/2016 | Liu | ......................... H04L 25/03 713/310 |

OTHER PUBLICATIONS

Final Office Action dated Sep. 28, 2017, issued in related U.S. Appl. No. 15/410,498 (4 pages).

Non-Final Office Action dated Jun. 19, 2017, issued in related U.S. Appl. No. 15/410,498 (6 pages).

Final Office Action dated Apr. 12, 2019, issued in related U.S. Appl. No. 15/865,326 (7 pages).

Non-Final Office Action dated Jan. 18, 2019, issued in related U.S. Appl. No. 15/865,326 (8 pages).

Non-Final Office Action dated May 4, 2018, issued in related U.S. Appl. No. 15/865,326 (11 pages).

First Search dated Dec. 24, 2016, issued in related Chinese Application No. 201410766321.2 (1 page).

First Office Action dated Jan. 3, 2017, issued in related Chinese Application No. 201410766321.2, with English Machine translation (10 pages).

* cited by examiner

METHOD AND SYSTEM FOR GENERATING A RAMPING SIGNAL

CROSS REFERENCE TO RELATED APPLICATION

The present application is a continuation of U.S. patent application Ser. No. 15/865,326, filed on Jan. 9, 2018, which is a continuation of U.S. patent application Ser. No. 15/410,498, filed on Jan. 19, 2017, now U.S. Pat. No. 9,894,307, which is a continuation of U.S. patent application Ser. No. 14/560,371, filed on Dec. 4, 2014, now U.S. Pat. No. 9,584,102, which claims the benefit of priority to U.S. Provisional Application No. 61/915,444, filed on Dec. 12, 2013, and entitled "A METHOD TO GENERATE A MONOTONIC RAMPING SIGNAL WITH LATCH PROPAGATED ENABLE SIGNAL". The above-referenced applications are hereby incorporated by reference in their entirety.

TECHNICAL FIELD

The present disclosure relates to methods and circuits for image sensing applications, in particular, to methods and circuits for generating a ramping signal as a reference signal for image sensor circuits.

BACKGROUND INFORMATION

Digital cameras, scanners, and other imaging devices often use image sensors, such as charge-coupled device (CCD) image sensors or complementary metal-oxide-semiconductor (CMOS) image sensors, to convert optical signals to electrical signals. An image sensor typically includes a grid of pixels, row access circuitry, column access circuitry, and a ramp signal generator. The pixels capture the light impinged on them and convert the light signals to electrical signals. The row access circuitry controls which row of pixels that the sensor will read. The column access circuitry includes column read circuits that read the signals from corresponding columns. The ramp signal generator generates a ramping signal as a global reference signal for column read circuits to record the converted electrical signal. In operation, the quality of the ramping signal can significantly affect the quality of the output of the image sensor. For example, a ramping signal with poor linearity can cause a gain non-linearity of the column read circuits. In addition, a ramping signal with a large glitch power can have a lost-bit effect. Moreover, a ramp signal generator with low power consumption and a small physical area is often desired.

SUMMARY

The present disclosure provides a system for generating a ramping signal. According to some embodiments, the system includes a plurality of storage circuits each including an input and an output. The output of a previous storage circuit is connected to the input of a next storage circuit. The storage circuits are configured to propagate a first enable signal based on a first control signal. The system also includes a plurality of first current generating circuits. Each first current generating circuit is coupled to the output of a corresponding storage circuit to receive the propagated first enable signal. The first current generating circuits are configured to generate a first current signal based on the propagated first enable signal.

The present disclosure also provides a method for generating a ramping signal. According to some embodiments, the method includes applying a first enable signal to a series of storage circuits, each of the storage circuits including an input and an output, the output of a previous storage circuit being coupled to the input of a next storage circuit; applying a clock signal to the series of storage circuits, wherein the clock signal enables the series of storage circuits to propagate the first enable signal through the series of storage circuits; and generating a first current signal based on the propagated first enable signal, wherein the first current signal increases every time when the first enable signal propagates through a storage circuit.

The present disclosure further provides a system for generating a ramping signal. The system includes a plurality of latches connected in series and configured to propagate a first enable signal based on a clock signal, and a plurality of first current generating circuits coupled to outputs of the latches. The first current generating circuits are configured to generate a first current signal based on the propagated first enable signal. The system further includes one or more second current generating circuits configured to generate a second current signal and a load block coupled to the plurality of first current generating circuits and the one or more second current generating circuits. The load block converts the first and second current signal to a voltage signal to generate the ramping signal.

DETAILED DESCRIPTION OF THE DRAWINGS

Reference will now be made in detail to the exemplary embodiments consistent with the embodiments disclosed herein and the examples of which are illustrated in the accompanying drawings. Wherever possible, the same reference numbers will be used throughout the drawings to refer to the same or similar parts.

Figure 1:
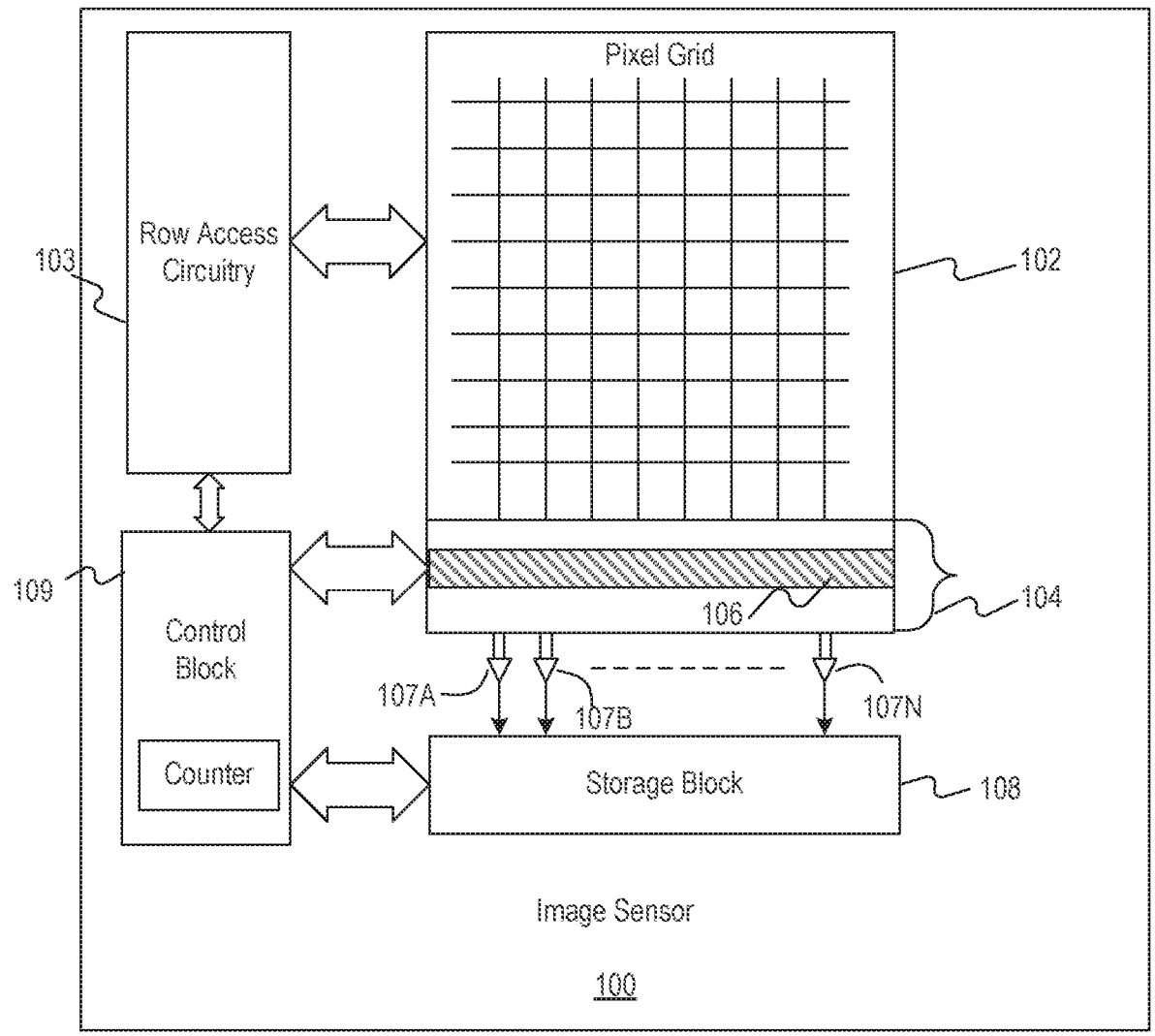
FIG. 1 is a diagram illustrating an exemplary image sensor comprising an exemplary embodiment of a pixel grid and an exemplary embodiment of column read circuits.

FIG. 1 is a diagram illustrating an exemplary image sensor 100. Image sensor 100 can be a CMOS type image sensor or a CCD type image sensor, or any other type of image sensors. Image sensor 100 may include a two-dimensional grid of pixels 102, row access circuitry 103, column access circuitry 104, a ramp signal generator 106, a series of comparators 107A-N, a storage block 108, and a control block 109. The image sensor circuitry is divided into blocks as shown in FIG. 1 for illustration purpose. A person having ordinary skill in the art should understand that at least some of these blocks can be integrated together on one chip.

Pixel grid 102 includes multiple pixels for sensing light signals and converting the light signals to electrical signals. Each pixel can generate a voltage that is proportional to the energy of the sensed light signal. As shown in FIG. 1, pixel grid 102 is electrically coupled to row access circuitry 103 and column access circuitry 104. Row accessing circuitry 103 can select one row at a time in pixel grid 102. When a particular row is selected, voltages generated by the pixels in that row can become accessible by, for example, column access circuitry 104.

Column access circuitry 104 includes multiple column read circuits (not shown) each corresponding and being coupled to a column in pixel grid 102. The column read circuits read the voltage signals generated by the pixels in the corresponding columns and provide output readout signals.

Ramp signal generator 106 generates a ramping signal, e.g., a monotonically increasing or decreasing voltage signal "Vramp." The internal circuits of ramp signal generator 106 will be described in detail below. The ramp signal generator 106 is described in the context of an image sensor. A person having ordinary skill in the art should appreciate that the disclosed ramp signal generator and the ramping signal can be used in other devices.

Comparators 107A-N each corresponds and is electrically coupled to one of the column read circuits to receive the readout signal. Comparators 107A-N are also electrically coupled to ramp signal generator 106 to receive the Vramp signal. Each comparator (e.g., 107A) compares the readout signal with the Vramp signal. The term "compare" is used in a broad sense in this application. For example, one way to compare the two signals is coupling the two signals to two input terminals of a comparator. Another way is to combine the two signals (or variations of the two signals) and compare the combined signal with a reference signal. The reference signal can be a reference voltage or current. In some embodiments, the reference signal can be a threshold voltage of a transistor, and when the combined signal reaches the reference signal level, it will turn on or off the transistor. Because the value of the reference signal and ramping signal can be known, the value of the input signal can be derived. A person having ordinary skill in the art should be able to design other ways to derive the value of the input signal. In some embodiments, the Vramp signal may start from zero and monotonically increase (or start with a maximum value and monotonically decrease). When Vramp changes from lower than the readout signal to higher than the readout signal, the comparator output will switch from, e.g., low to high (e.g., from 0 to 1). Alternatively, the readout signal and the Vramp signal, or variations of these signals, can be combined and when the combined signal reaches a certain level, the comparator output will switch.

As shown in FIG. 1, the comparators 107A-N are electrically coupled to a storage block 108. Storage block 108 can include, for example, static random access memory (SRAM), dynamic random access memory (DRAM), flash memory, or any other type of storage circuits that can store analog or digital signals.

Control block 109 is electrically coupled to row access circuitry 103, column access circuitry 104, ramp signal generator 106, comparators 107A-N, and storage block 108, and provides one or more signals for controlling these circuits. For example, control block 109 can provide control signals to row access circuitry 103 for controlling the speed of accessing the rows in pixel grid 102. Control block 109 can also generate any desired signals for controlling other circuits in image sensor 100.

Control block 109 may include one or more counters that are electrically coupled to comparators 107A-N and storage block 108. For example, each counter may be coupled to a corresponding comparator 107. Control block 109 may also generate a clock signal to trigger the counter to count the clock cycles. The comparators 107A-N compare Vramp and the readout signals from the columns of pixel grid 102. At the comparator, for example, comparator 107A, when Vramp becomes higher than the readout signal from column A, or the combination of Vramp and the readout signal reaches to a certain level, comparator 107A switches its output from 0 to 1, and that will trigger storage block 108 to record the value in the counter corresponding to comparator 107A at that moment. The recorded value can be a digital representation of the readout signal from column A.

As discussed above, row accessing circuitry 103 can select one row at a time in pixel grid 102 and column access circuitry 104 can read the voltage signals generated by the pixels in the selected row. The voltage signals obtained by column access circuitry 104 are converted to digital signals and stored in storage block 108. After all rows are selected and all voltage signals are readout, the image sensed by pixel grid 102 can be represented by a two-dimensional grid of digital representations stored in storage block 108 and that can be used to form a digital image.

Figure 2:
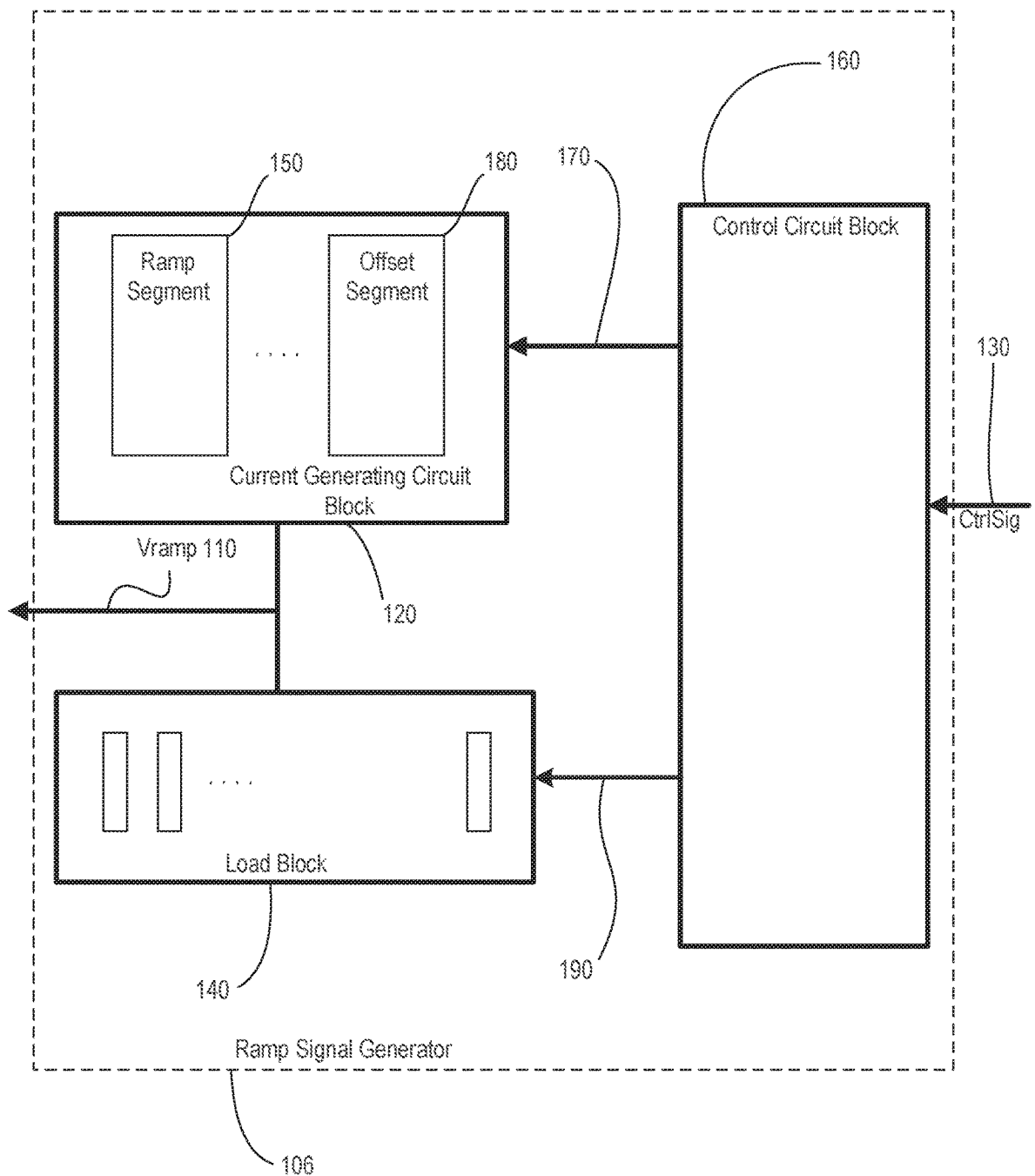
FIG. 2 is a block diagram illustrating an exemplary ramp signal generator.

FIG. 2 is a block diagram illustrating an exemplary ramp signal generator 106. Ramp signal generator 106 may include, among other things, a current generating circuit block 120, a load block 140, and a control circuit block 160. As shown in FIG. 2, these circuits are electrically coupled to each other.

Current generating circuit block 120 may include one or more current generating segments, for example, one or more ramp segments 150 and one or more offset segments 180. A ramp segment 150 can include one or more current generating circuits that generate a ramp current signal. An offset segment 180 can include one or more current generating circuits that generate an offset current signal. In some embodiments, the ramp current signal, in conjunction with load block 140, provides a first component of the ramping signal Vramp 110, and the offset current signal, in conjunction with load block 140, provides a second component of the ramping signal Vramp 110. In some embodiments, only the ramp current signal generated by ramp segment 150 is used to generate ramping signal Vramp 110.

In some embodiments, ramp signal generator 106 has a generally longitudinal shape that extends along an edge of pixel grid 102, for example, in a row direction as shown in FIG. 1. Within ramp signal generator 106, the ramp segment 150 and the offset segment 180 can be logically evenly distributed. In some embodiments, the circuits in the ramp segment 150 and the offset segment 180 can be physically distributed in the longitudinal direction. This layout of ramp signal generator 106 can help save the overall space of the image sensor. In addition, this layout can also help place ramp signal generator 106 close to column access circuitry 104 and comparators 107A-N, as shown in FIG. 1. This arrangement can help reduce voltage drop from the output of the ramp signal generator 106 to the input of comparators 107A-N. A person having ordinary skill in the art should understand that ramp segment 150 and offset segment 180 can be physically distributed in any other desired manner.

Moreover, by physically placing ramp signal generator 106 in close proximity to the corresponding column access circuitry 104, the non-linearity or glitch power of the ramping signal Vramp 110 can also be reduced or minimized; the layout shape of the image sensor 100 can have more flexibility; and the sensing speed of the image sensor 100 can also be improved.

Load block 140 may include, for example, resistive, capacitive, and/or inductive loads for generating ramping signal Vramp 110 based on the ramp current signal generated by ramp segment 150 and/or the offset current signal generated by offset segment 180. For example, load block 140 may include one or more resistors. The currents generated by ramp segment 150 and offset segment 180 pass through the resistors to generate the ramping voltage signal Vramp 110.

Control circuit block 160 can be electrically coupled to control block 109 of the image sensor 100 to receive one or more control signals 130. In some embodiments, control circuit block 160 can be a portion of control block 109. Control signal 130 can include any number of control signals in analog or digital domain. Based on control signal 130, control circuit block 160 can generate a control signal 170 for controlling current generating circuit block 120. Control signal 170 can include any number of control signals in analog or digital domain, and can provide, for example, a clock signal, a ramp enable signal, and/or any control signals for the operation of current generating circuit block 120. Control circuit block 160 can also provide a control signal 190 for controlling load block 140. Similarly, control signal 190 can include any number of control signals in analog or digital domain. Control signal 190 configures the load in load block 140. For example, control signal 190 can adjust the total equivalent resistance load of load block 140 by turning on or off of one or more resistors. In some embodiments, the total equivalent resistance load can be adjusted in a binary weighted manner (e.g., adjusting the resistance load by a binary-coded control signal). In some embodiments, the total equivalent resistance load can be adjusted in thermometer code manner (e.g., adjusting the resistance load by a thermometer coded control signal), or in any other desired manner. It should be appreciated that control circuit block 160 can include any logic that is suitable for generating control signals 170 and 190 based on control signal 130. For example, control circuit block 160 can include combinational logics and/or sequential logics.

Figure 3:
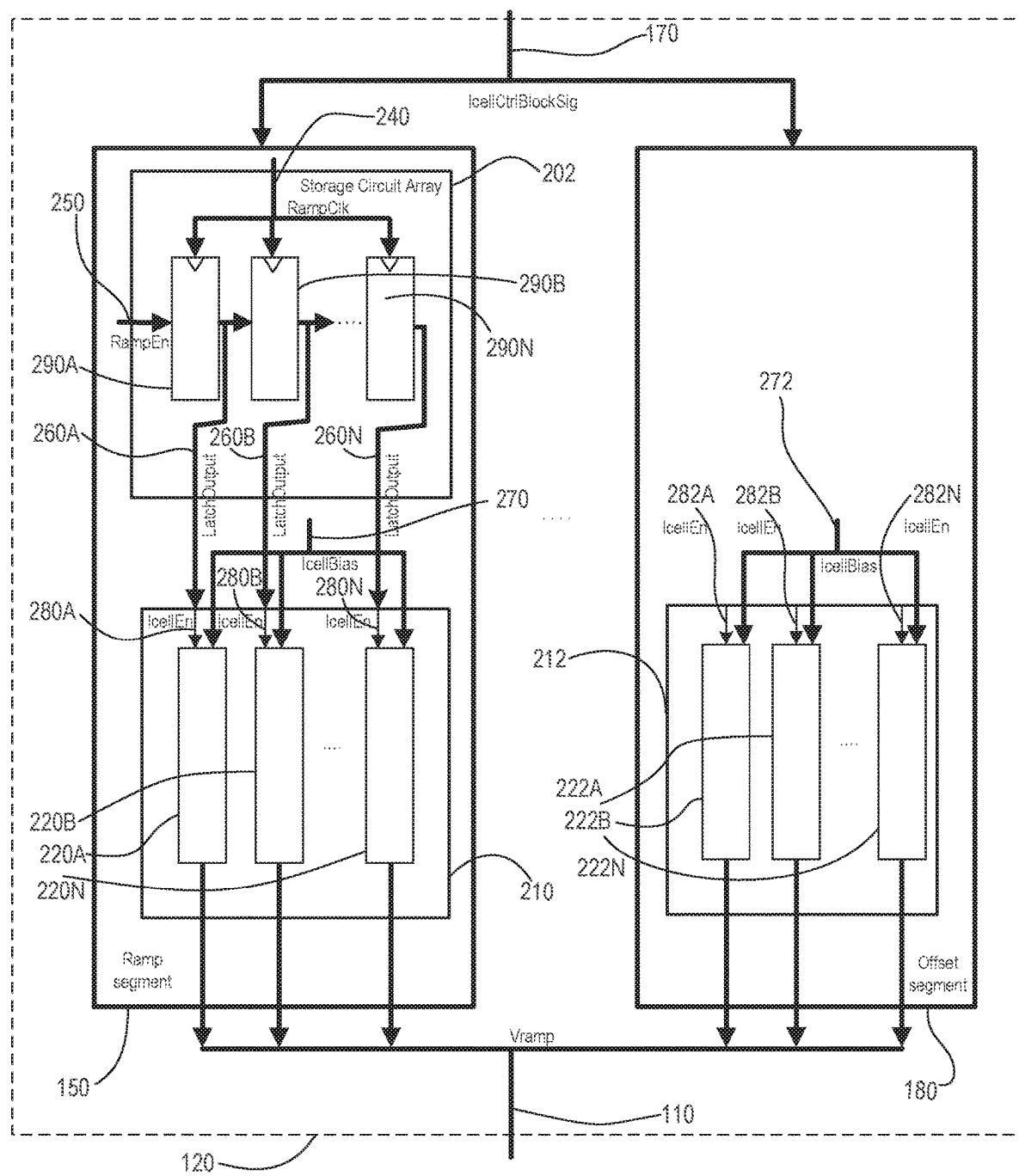
FIG. 3 is a block diagram illustrating an exemplary current generating circuit block comprising an exemplary embodiment of a ramp segment and an exemplary embodiment of an offset segment.

FIG. 3 is a block diagram illustrating an exemplary embodiment of current generating circuit block 120. As shown in FIG. 3, in some embodiments, ramp segment 150 can include a storage circuit array 202 and a ramp current generating cell block 210. Storage circuit array 202 can include one or more storage circuits 290A-N (collectively referred to as storage circuits 290) connected in a chain such that an output of a previous storage circuit is electrically coupled to an input of a next storage circuit. For example, the output of storage circuit 290A is electrically coupled to storage circuit 290B and similarly, the output of storage circuit 290B is electrically coupled to storage circuit 290C.

Figure 5:
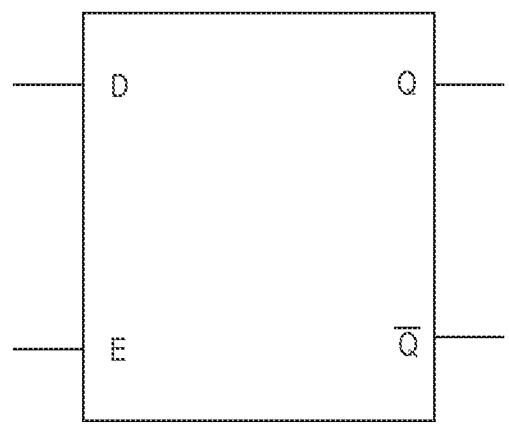
FIG. 5 is a block diagram of an exemplary gated or clocked D latch.

Storage circuits 290 can be any circuits that are capable of storing one or more stable logic states (e.g., "0" or "1"). Storage circuits 290 can include, for example, latches or flip-flops. As an example, storage circuits 290 can be gated or clocked D latches as shown in FIG. 5. Each latch has a data input terminal D, a clock or enable terminal E, and two output terminals. When the clock terminal E is on, the input signal received at the terminal D passes through the circuit, to the output Q.

Storage circuit array 202 can be electrically coupled to control circuit block 160 to receive control signal 170. Control signal 170 may include a control signal, e.g., a clock signal 240 and a ramp enable signal 250. In some other embodiments, ramp enable signal 250 may be provided from another source, such as control block 109. Clock signal 240 can be a digital or analog clock signal that provides timing information (e.g., a periodical pulse) for operating storage circuits 290A-N. Storage circuits 290 can be single or double edge sampling circuits, and can be rising or falling edge triggering circuits, e.g., edge triggering registers. Ramp enable signal 250 is the input of the first storage circuit 290A in storage circuit array 202. Each of storage circuits 290A-N outputs a signal 260, which is coupled to the input of the next storage circuit (except for the last storage circuit). In the example of the storage circuit as shown in FIG. 5, clock signal 240 can be coupled to the clock terminal E, ramp enable signal 250 can be coupled to the data input terminal D, and output terminal Q outputs signal 260.

Ramp current generating cell block 210 can, for example, include one or more ramp current generating circuits 220A-N (collectively referred to as ramp current generating circuits 220). Ramp current generating circuits 220A-N can be coupled to the output of corresponding storage circuits 290A-N to receive the output signals 260A-N. Ramp current generating circuits 220A-N use the output signals 260A-N as enable signals 280A-N to enable ramp current generating circuits 220A-N to generate ramp current signals. For example, if enable signal 280A is asserted (e.g., becomes "1" or high), ramp current generating circuit 220A can be turned on to generate a ramp current signal.

Ramp current generating circuits 220 can also receive and be controlled by a bias signal 270 from, for example, control block 160. Bias signal 270 can be included in control signal 170. Bias signal 270 can be a voltage or current signal providing a biasing voltage or current to ramp current generating circuits 220. As shown in FIG. 3, each of the ramp current generating circuits 220 can be individually controlled by enable signal 280 and bias signal 270. The outputs of ramp current generating circuits 220 are connected to a node that generates the ramping signal Vramp 110.

The operation of ramp segment 150 will be explained in conjunction with FIG. 3. The explanation is based on an assumption that storage circuits 290A-N are single and rising edge triggering circuits. As discussed above, a person having ordinary skill in the art should understand that storage circuits 290A-N can be falling edge triggering circuits or double-edge triggering circuits. When ramp enable signal 250 is asserted at the input of storage circuit 290A, and when clock signal 240 is at the first rising edge, storage circuit 290A switches its output signal 260A to high. The output signal 260A is applied to the input of storage circuit 290B. When the next cycle of rising edge of clock signal 240 arrives, storage circuit 290B switches its output signal 260B to high. The output signal 260B is then applied to the input of storage circuit 290C. In this manner, ramp enable signal 250 propagates through storage circuits 290A-N based on clock signal 240.

When output signal 260A is high, enable signal 280A is high (which is the same signal as 260A). When enable signal 280A is high and bias signal 270 is high, it turns on ramp current generating circuit 220A to generate a ramp current. Similarly, after the second rising edge of clock signal 240, enable signal 280B becomes high, which in turn, turns on ramp current generating circuit 220B to generate a second ramp current. In this manner, as ramp enable signal 250 propagates through storage circuits 290A-N, enable signals 280A-N successively become high, which turn on current generating circuits 220A-N. The total ramp current generated by ramp current generating circuits 220A-N are converted to a voltage signal by load block 140. The voltage signal can be the ramping signal Vramp 110 or a component of the ramping signal Vramp 110. The above describes an example of generating a monotonically increasing ramping signal. A person having ordinary skill in the art should understand that the circuits can be configured to generate other types of ramping signals. For example, ramp current generating circuits 220A-N can be initially configured with "on" state, and enable signals can be configured to turn off the ramp current generating circuits 220A-N. In such a configuration, the ramping signal Vramp 110 will be a monotonically decreasing signal.

Referring again to FIG. 3, offset segment 180 can include an offset current generating cell block 212. Offset current generating cell block 212 can, for example, include one or more offset current generating circuits 222A-N (collectively referred to as offset current generating circuits 222). In some embodiments, offset current generating circuits 222 can be the same or similar to ramp current generating circuits 220. In some embodiments, offset current generating circuits 222 can be different from ramp current generating circuits 220. For example, an offset current generating circuit 222 can include transistors that have smaller size (e.g., width and/or length) than transistors in ramp current generating circuits 220.

Offset current generating circuits 222 can receive enable signals 282A-N and a bias signal 272. In some embodiments, enable signals 282A-N and bias signal 272 can be included in control signal 170 generated by control circuit block 160 or any other circuits suitable for generating such signals. In some embodiments, enable signals 282A-N and bias signal 272 can be the same as or different from corresponding enable signal 280A-N and bias signal 270, respectively. In some embodiments, each of offset current generating circuits 222 can be turned on or off individually based on enable signal 282 and bias signal 272. For example, if enable signal 282A and bias signal 272 are asserted, offset current generating circuit 222A is turned on to generate an offset current signal. If enable signal 282B and bias signal 272 are asserted, offset current generating circuit 222B is turned on to generate another offset current signal. By controlling the number of offset current generating circuits 222 that are turned on, the total amount of current generated by offset current generating circuits 222 can be configured in any desired manner. As shown in FIGS. 2 and 3, the currents generated by ramp current generating circuits 220 and offset current generating circuits 222 can be combined to generate ramping signal Vramp 110.

Figure 4:
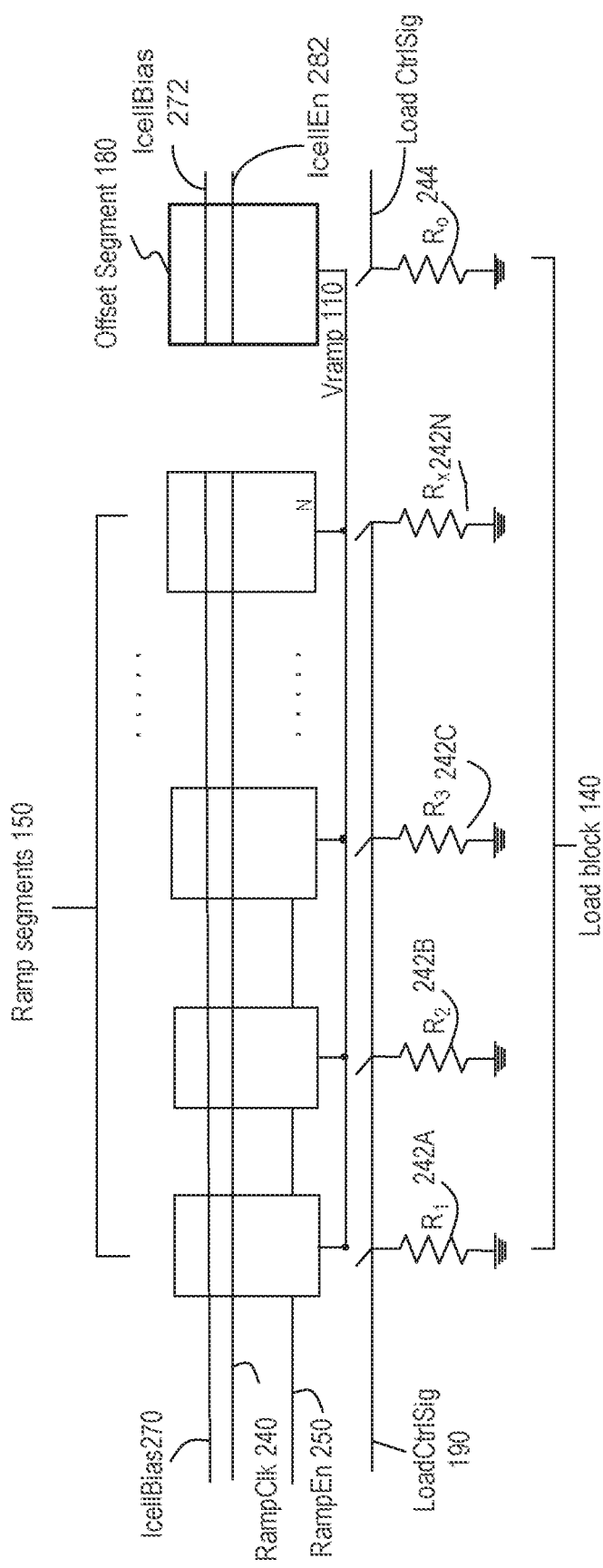
FIG. 4 is a more detailed block diagram illustrating an exemplary ramp segment, an exemplary offset segment, and exemplary load circuits corresponding to those shown in FIG. 2.

FIG. 4 illustrates one embodiment of ramp segment 150 and offset segment 180. As shown in FIG. 4, load block 140 includes a series of resistors 242A-N and 244. Resistors 242A-N are coupled to ramp segments 150 and resistor 244 is coupled to offset segment 180. In certain embodiments, both resistors 242A-N and resistor 244 are coupled to ramping signal Vramp 110. The ramp current generated by ramp segment 150 and the offset current generated by offset segment 180 are combined at the node, where the combined current is converted to the ramping voltage signal Vramp 110, by the resistors 242A-N and 244. Control circuit block 160, by providing control signal 190, can control the number of resistors that are electrically coupled to ramp segment 150 and offset segment 180.

Figure 6:
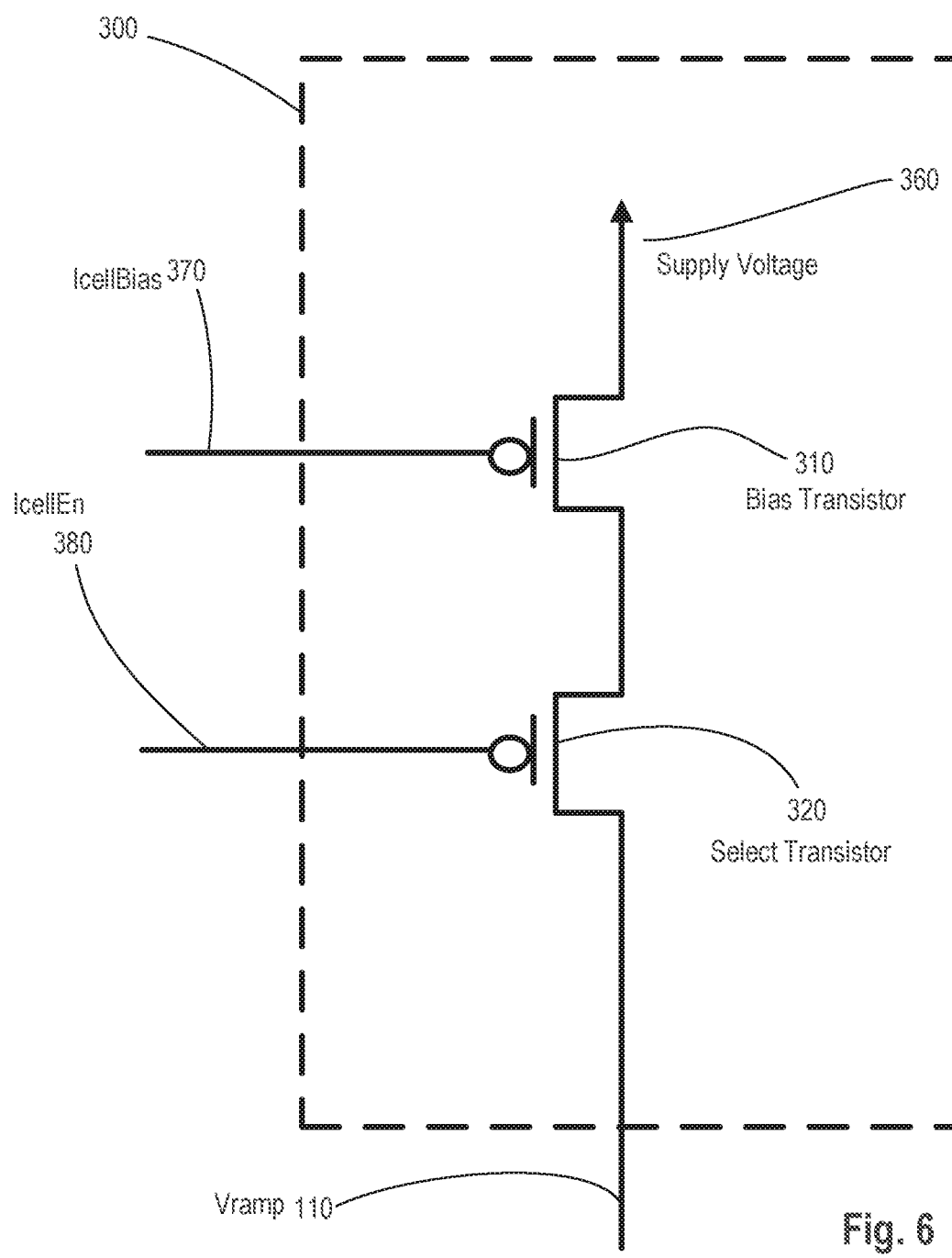
FIG. 6 is a schematic diagram of an exemplary embodiment of a current generating circuit.

FIG. 6 is a schematic diagram of an exemplary embodiment of a current generating circuit 300. Current generating circuit 300 can be used as, for example, a ramp current generating circuit 220 and/or an offset current generating circuit 222. In some embodiments, current generating circuit 300 can include a bias transistor 310 and a select transistor 320. Bias transistor 310 and/or select transistor 320 can be P-type metal-oxide-semiconductor (PMOS) transistors, N-type metal-oxide-semiconductor (NMOS) transistors, or any other type of transistors (e.g., bipolar transistors). The size (e.g., transistor width and gate length) and the type of bias transistor 310 and select transistor 320 can be varied. As an example, if offset current generating circuit 222 generates an offset current that is smaller than the ramp current generated by ramp current generating circuit 220, the size of bias transistor 310 and/or select transistor 320 in offset current generating circuit 222 can thus be smaller than the size of corresponding transistors in ramp current generating circuit 220. Moreover, the size of bias transistor 310 and the size of select transistor 320 can be the same or different. It should be understood that the size of bias transistor 310 and the size of select transistor 320 can be configured in any desired manner.

As discussed above, in some embodiments, PMOS transistors can be used to implement bias transistor 310 and select transistor 320. As shown in FIG. 6, when PMOS transistors are used, the source terminal of bias transistor 310 can be electrically coupled to a supply voltage 360. The drain terminal of bias transistor 310 can be electrically coupled to the source terminal of select transistor 320. The drain terminal of select transistor 320 can be electrically coupled to, for example, load block 140 to enable the generating of ramping signal Vramp 110. The gate terminal of bias transistor 310 and the gate terminal of select transistor 320 can be electrically coupled to bias signal 370 and enable signal 380, respectively. In some embodiments, bias signal 370 can be a digital or analog signal providing a biasing voltage or current to bias transistor 310. Enable signal 380 can be an analog or digital signal that turns on or off select transistor 320, such that the current generated by current generating circuit 300 can be enabled or disabled. Bias signal 370 and enable signal 380 can represent, for example, bias signal 270 and enable signal 280 when current generating circuit 300 represents a ramp current generating circuit 220, or bias signal 272 and enable signal 282 when current generating circuit 300 represents an offset current generating circuit 222.

In certain embodiments, current generating circuit 300 may also include one or more cascode transistors (not shown). The cascade transistors may be electrically coupled to select transistor 320 and/or bias transistor 310 to increase the amplifier gain.

Figure 7A:
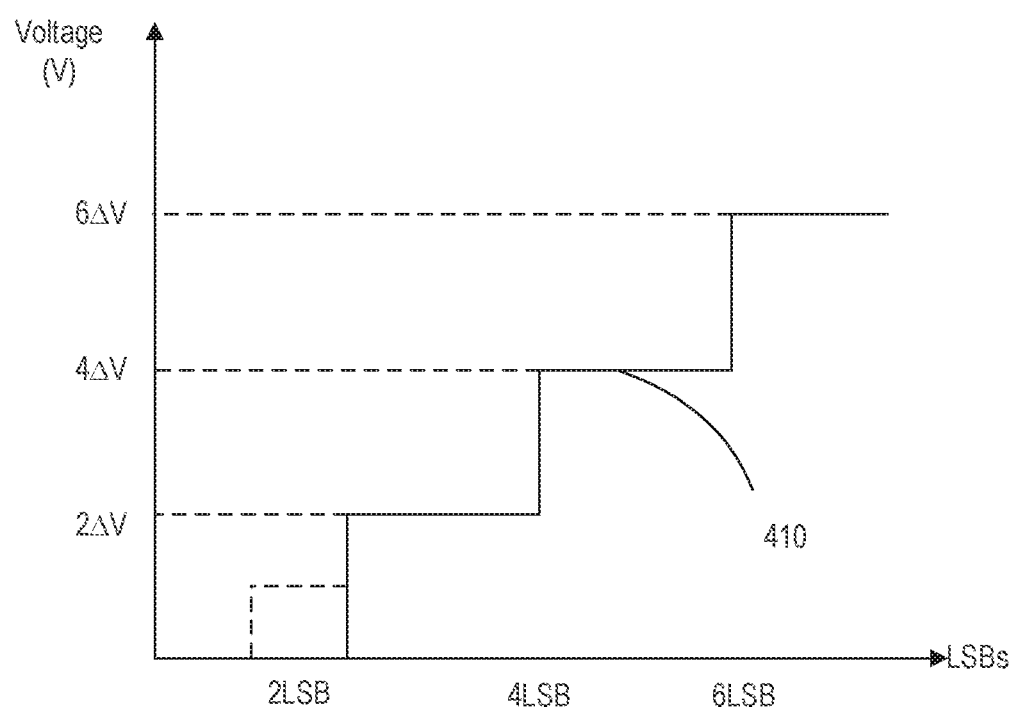
FIG. 7A is a diagram illustrating an exemplary voltage-counter value relation of a first component of the ramping signal corresponding to a ramp current signal generated by the exemplary ramp segment shown in FIGS. 2A and 2B.
Figure 7B:
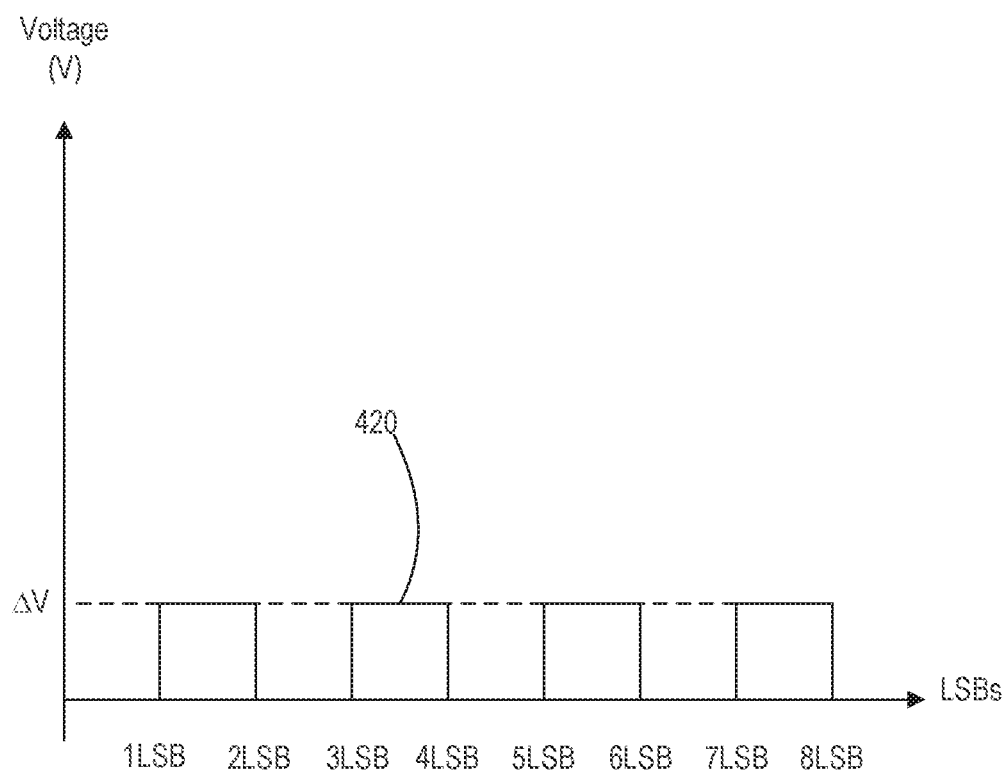
FIG. 7B is a diagram illustrating an exemplary voltage-counter value relation of a second component of the ramping signal corresponding to an offset current signal generated by the exemplary offset segment shown in FIGS. 2A and 2B.
Figure 7C:
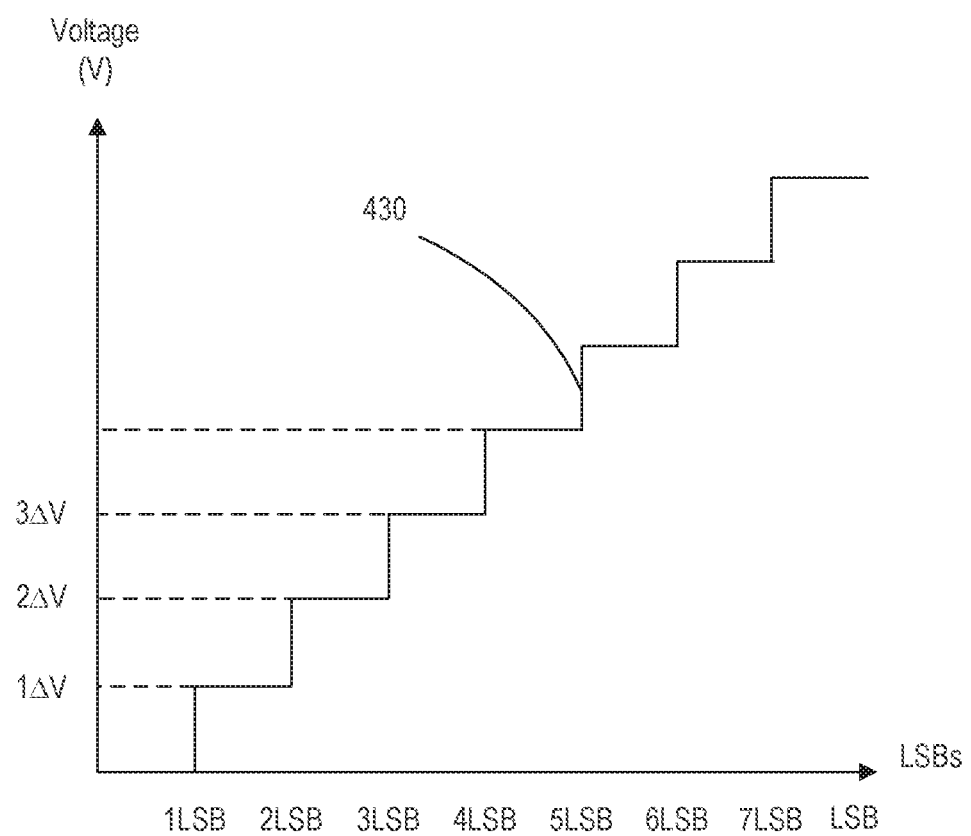
FIG. 7C is a diagram illustrating an exemplary voltage-counter value relation of the ramping signal corresponding to the sum of the current signals generated by the ramp segment and the offset segment shown in FIGS. 2A and 2B.

FIG. 7A is a diagram illustrating an exemplary voltage-counter value relation curve 410 corresponding to the first component of ramping signal Vramp 110 generated by the current from ramp segment 150. FIG. 7B is a diagram illustrating an exemplary voltage-counter value relation curve 420 corresponding to the second component of ramping signal Vramp 110 generated by the current from offset segment 180. FIG. 7C is a diagram illustrating an exemplary voltage-counter value relation 430 corresponding to the ramping signal Vramp 110 generated by the sum of the currents generated by ramp segment 150 and offset segment 180.

As shown in FIG. 7A, the vertical axis represents a voltage level measured in volts, and the horizontal axis represents the value of the counter (e.g., the counter shown in FIG. 1, which is used to record the corresponding ramping signal) measured by the number of least significant bits (LSBs). The counter is driven by a clock signal, for example, clock signal 240 or any other clock signal, and the counter value is associated to time. Thus, the diagrams in FIGS. 7A-C also show voltage level and time relations. In operation, ramping signal Vramp 110, as a reference signal, may need to increase from 0V to a predetermined voltage (e.g., the power supply voltage). Different voltage levels can be represented by different digital representations measured by the number of LSBs. For example, 0V can be represented by a 0 LSB, $2\Delta V$ can be represented by 2 LSBs, and the maximum voltage can be represented by the maximum number of LSBs (e.g., 8 LSBs).

As discussed above, when ramp enable signal 250 is asserted and clock signal 240 is applied, ramp enable signal 250 can propagate through storage circuits 290A-N. As ramp enable signal 250 propagates, ramp current generating circuits 220A-N can be turned on one after another to generate ramp currents. As a result, the total amount of current generated by ramp current generating circuits 220 increases with the clock signal 240. The current generated by ramp current generating circuits 220 is applied to load block 140, which converts the current to a voltage signal. The converted voltage signal constitutes the first component of ramping signal Vramp 110, as shown in FIG. 7A.

For example, the first component of ramping signal Vramp 110, represented by 410, can start at 0V. After ramp enable signal 250 propagates through storage circuit 290A, ramp current generating circuit 220A can be turned on to generate a ramp current that flows through load block 140. As a result, the first component of ramping signal Vramp 110 can increase to a voltage level of $2\Delta V$ corresponding to 2 LSBs in the horizontal axis. Similarly, after ramp enable signal 250 propagates further, more ramp current generating circuits 220 can be turned on and ramping signal Vramp 110 can increase to $4\Delta V$, $6\Delta V$, etc., corresponding to 4 LSBs, 6 LSBs, etc., respectively. As seen in FIG. 7A, the first component of ramping signal Vramp 110 can be a monotonically increasing signal with a staircase shape. In certain embodiments, filtering circuits (not shown) may be coupled to ramp current generating circuits 220 such that the first component of ramping signal 110 is a smooth ramp curve, e.g., a curve without stairs, glitches, and/or spikes.

In some other embodiments, the first component of ramping signal Vramp 110 can be a monotonically decreasing signal. For example, initially, all ramp current generating circuits 220 can be turned on and the first component of ramping signal Vramp 110 can start at the maximum voltage level (e.g., power supply voltage) corresponding to 8 LSBs. An inverted ramp enable signal 250 can propagate through storage circuits 290A-N to turn off one or more of ramp current generating circuits 220. As a result, the first component of ramping signal Vramp 110 can decrease to $6\Delta V$, $4\Delta V$, $2\Delta V$, etc., corresponding to 6 LSBs, 4 LSBs, 2 LSBs, etc.

Referring to FIG. 7B, in some embodiments, offset segment 180 can dynamically generate an offset current. The offset current can be configured to generate an offset voltage $\Delta V$, which is the half of the step size of the voltage generated by ramp segment 150 shown in FIG. 7A. In some embodiments, enable signals 282A-N can be clock or pulse signals that have the same frequency as clock signal 240. Enable signals 282A-N control offset current generating circuits 222 to generate a current in a square wave form, which can be converted to a voltage signal (second component of ramping signal Vramp 110) in a square wave form, as shown in FIG. 7B.

FIG. 7C illustrates the ramping signal Vramp 110, which is the combination of the first component in FIG. 7A and second component in FIG. 7B. As shown in FIG. 7C, the exemplary result ramping signal 430 is a monotonically increasing signal. As shown in FIG. 7A, the step size of the first component of ramping signal Vramp 110 is $2\Delta V$. As shown in FIG. 7C, after combining the first component with the second component, the step size of ramping signal Vramp 110 is reduced to $\Delta V$. As a result, the resolution of ramping signal Vramp 110 is increased. The system achieves the higher resolution by using the offset segment 180. Such an arrangement reduces the design complexity without sacrificing the performance of ramp signal generator 106. It should be appreciated that offset segment 180 can generate offset currents in any desired manner, such as at a frequency that is a fraction or a multiplication of the frequency of clock signal 240. For example, storage circuits 290A-N can be double-edge trigger circuits, and the frequency of enable signal 282 of offset segment 180 can be double of the frequency of clock signal 240 of ramp segment 150. In some other embodiments, the offset segment 180 can be configured to generate static offset currents that do not change over time. In some applications, which do not require a high resolution, offset segment 180 may be disabled. In some other embodiments, the ramp signal generator 106 can be implemented without an offset segment. For example, ramp segment 150 can be implemented with sufficient number of storage circuits and ramp current generating circuits to achieve a desired resolution. In this situation, ramp signal generator 106 may not need an offset segment.

In some other embodiments, offset segment 180 can further include a storage circuit array (not shown) similar to storage circuit array 202. An offset enable signal (not shown), which can be similar to ramp enable signal 250, can propagate through the storage circuit array associated with offset segment 180. In a similar manner to those described above with respect to the operation of ramp current generating circuits 220, one or more offset current generating circuits 222 can be turned on in sequence such that the offset current increases in a staircase manner with a step size of $\Delta I$. Correspondingly, the offset voltage can increase in a staircase manner with a step size of $\Delta V$. In certain embodiments, filtering circuits (not shown) may be coupled to offset current generating circuits 222 such that the offset voltage is a smooth ramp curve, e.g., a curve without stairs, glitches, and/or spikes.

The second component of ramping signal Vramp 110 (i.e., offset voltage) can be adjusted with different factors. For example, as described above, the magnitude of offset voltage can be configured by the number of offset current generation circuits 222. In some embodiments, the magnitude of offset voltage can also be configured by the voltage or current level of bias signal 272. For example, if the voltage or current level of bias signal 272 increases, the offset current generated by offset current generation circuits 222 can increase.

As a result, the magnitude of offset voltage can also increase. The magnitude of offset voltage can also be configured by the size of bias transistor 310 (e.g., transistor width and gate length). For example, if the width of bias transistor 310 increases, the offset current generated by offset current generation circuits 222 can increase. As a result, the magnitude of offset voltage can also increase.

Figure 8:
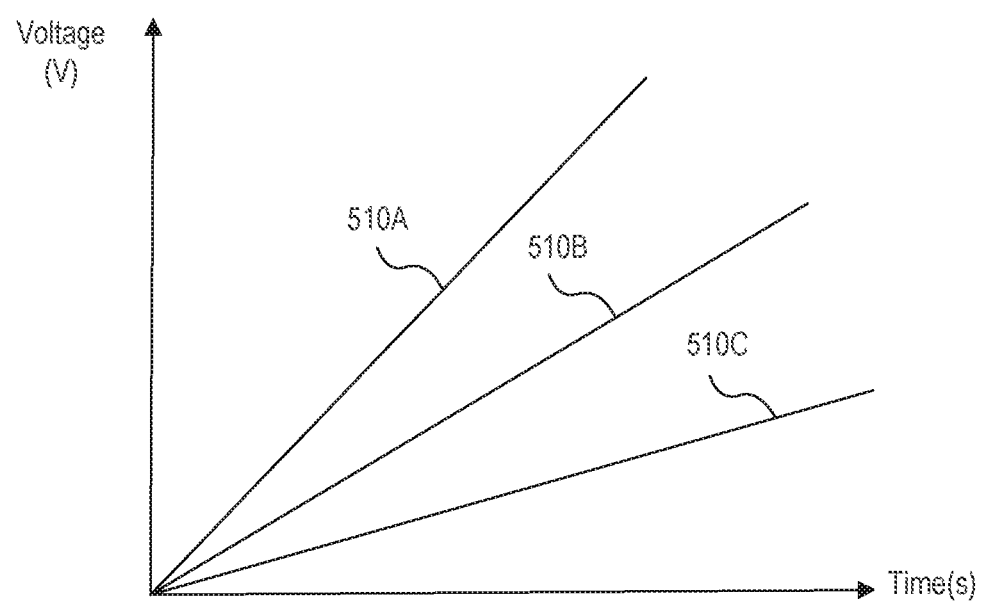
FIG. 8 is a diagram illustrating exemplary voltage-time relations of a plurality of ramping signals.

FIG. 8 is a diagram illustrating exemplary voltage-time relation curves 510A-C of ramping signal Vramp 110. In FIG. 8, the vertical axis represents the voltage level measured in volts; the horizontal axis represents the time measured in seconds. As shown in FIG. 8, ramping signal Vramp 110 can have different voltage-time ratios and the curves 510A-C can have different slopes. The slope of ramping signal Vramp 110 can be important in many applications. For example, in CMOS image sensor applications, the slope of ramping signal Vramp 110 can determine the analog to digital signal converting factor, which can be equal to the signal path gain. Signal path gain can be defined as the input signal swing divided by the conversion delay of analog to digital converters used in the image sensor circuitry. A higher slope of ramping signal Vramp 110 can correspond to a lower signal path gain. In particular, an increasing slope of ramping signal Vramp 110 denotes an increasing voltage difference within one unit time period, such as one counter clock period. As a result, an increasing slope can result in a decreasing analog to digital signal converting factor, and thus a decreasing signal path gain.

The slope can be adjusted by many factors, for example, by adjusting the current generated by current generating circuits 220, the length of the ramping signal Vramp 110, and the total resistance of the load block 140.

In some embodiments, the current generated by current generating circuits 220 can be adjusted by at least one of: the voltage or current level of bias signal 270; the size of bias transistor 310 (which is used to implement current generating circuits 220); the number of ramp current generating circuits 220.

In some embodiments, the length of ramping signal Vramp 110 can be adjusted by changing the time or speed that enable signal 250 propagates through storage circuits 290. The time or speed can be adjusted by adjusting at least one of: the frequency of clock signal 240, the length of time of ramp enable signal 250, and the number of storage circuits 290 and ramp current generating circuits 220.

The load of load block 140 can be adjusted by adjusting the number of load components (e.g., number of resistors) connected and/or the capacity of each component (e.g., resistance of the resistors).

Referring back to FIG. 8, curve 510A has a slope that is greater than that of curve 510 6, which has a slope that is greater than that of curve 510C. In some embodiments, curve 510A may represent ramping signal Vramp 110 that has at least one of: a larger number of ramp current generating circuits 220, a higher or lower biasing voltage provided by bias signal 370, a larger load provided by load block 140, or a higher frequency of clock signal 240. It should be appreciated that while curves 510A-C are shown as monotonic increasing signal (e.g., a linearly ramping signal from a low voltage to a high voltage), ramp signal generator 106 can be configured to generate ramping signal Vramp 110 that has any desired curve (e.g., a non-monotonic curve and/or a non-linear curve). A linear curve is a curve that has a mathematical relationship or function that can be graphically represented as a straight line, where two quantities corresponding to the straight line are directly proportional to each other.

Figure 9:
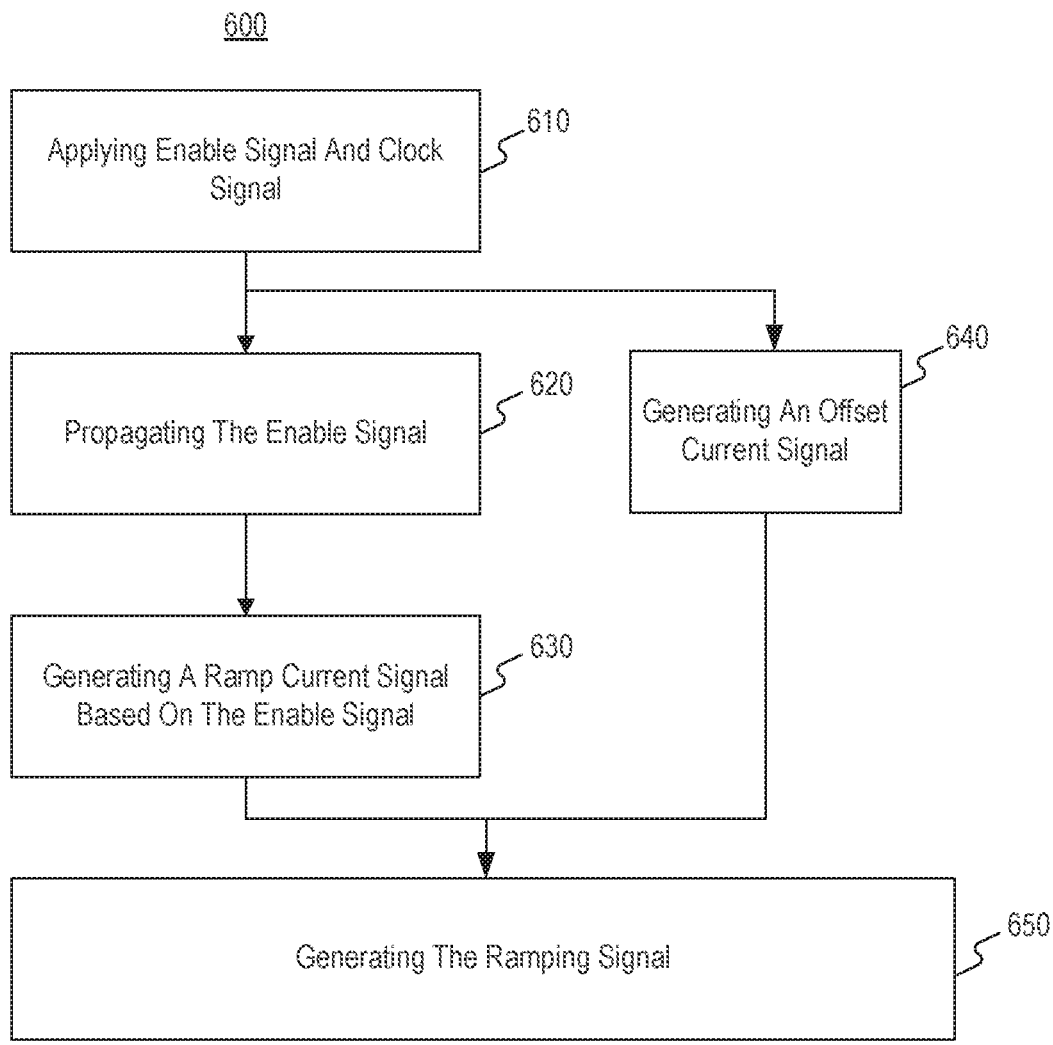
FIG. 9 is a flowchart representing an exemplary method for generating a ramping signal.

FIG. 9 is a flowchart representing an exemplary method for generating a ramping signal. It will be readily appreciated that the illustrated procedure can be altered to include less or more steps. In an initial step 610, enable signal 250 and clock signal 240 are applied to ramp signal generator 106. Ramp signal generator 106, via storage circuits 290, can propagate (step 620) ramp enable signal 250 based on clock signal 240. As shown in FIG. 9, ramp signal generator 106, via ramp current generating circuits 220, can generate (step 630) a ramp current signal based on the propagated ramp enable signal 250.

As discussed above, in some embodiments, ramp signal generator 106 may include an offset segment 180 that generates an offset current. The clock signal may be applied to offset segment 180 for controlling offset segment 180 to generate the offset current at step 640. At step 650, the ramp current and offset current are converted to the ramping signal Vramp 110, via load block 140.

In some embodiments, ramp segment 150 can generate a plurality of ramping signals at any specific times. Upon generating the ramping signals at the specific times, ramp enable signal 250 can stop propagate. One or more of these ramping signals can generate a first component of ramping signal Vramp 110. And one or more of other ramping signals can generate a second component (and in some embodiments, a third component, a fourth component, etc.,) of ramping signal Vramp 110. The second component of ramping signal Vramp 110 can be used as an fixed offset signal to increase the resolution of ramping signal Vramp 110 as discussed above. In this manner, ramp signal generator 106 can generate a high resolution ramping signal without using offset segment 180. A person of ordinary skill in the art that the one ramp segment 150 can generate a plurality of ramping signals such that a plurality of fixed offset signals can be obtained at different specific times as required. Moreover, in some embodiments, by generating a plurality of ramping signals, ramp segment 150 can enable the capability of using two or more ramping signals in the analog to digital conversion (ADC) to reduce the vertical fixed pattern noise in CMOS image sensor applications. As described above, ramp segment 150 can generate a plurality of offset signals. These offset signals can cancel certain circuit offsets such that the variation of the equalized point of comparator 107 is reduced or minimized. As a result, the vertical fixed pattern noise is reduced.

In some embodiments, ramp signal generator 106 can include two ramp segments 150. The two ramp segments 150 can propagate two enable signals 250 from both ends of current generating circuits 220 to minimize the IR voltage drop across the ramping signal Vramp 110. In certain embodiments, the two ramp segments 150 can propagate two enable signals 250 from the middle of current generating circuits 220 to both ends. In some embodiments, by using at least one of ramp segment 150 and offset segment 180, ramping voltage signal Vramp 110 can be generated without using a decoder and/or encoder circuits.

In the preceding specification, the subject matter has been described with reference to specific exemplary embodiments. It will, however, be evident that various modifications and changes may be made without departing from the broader spirit and scope of the subject matter as set forth in the claims that follow. The specification and drawings are accordingly to be regarded as illustrative rather than restrictive. Other embodiments may be apparent to those skilled in the art from consideration of the specification and practice of the embodiments disclosed herein.

What is claimed is:

1. A system for generating a ramping signal, comprising:
a plurality of storage circuits each including an input and an output, the output of a previous storage circuit being connected to the input of a next storage circuit, the storage circuits being configured to propagate an enable signal according to a first clock signal;
a plurality of current generating circuits, each configured to generate a respective first current based on a respective output of a respective storage circuit; and
an offset circuit configured to generate an offset current according to a second clock signal, the frequency of one of the first and second clock signals being a multiple of a frequency of the other of the first and second clock signals;
wherein the ramping signal is based on the first currents and the offset current.

2. The system of claim 1, further comprising:
a load block configured to generate the ramping signal based on the first currents and the offset current.

3. The system of claim 2, wherein:
the load block is further configured to generate a first voltage based on the first currents, the first voltage having a staircase shape, the staircase shape having a step size, wherein the ramping signal is based on the first voltage and the offset current.

4. The system of claim 3, wherein:
the offset current has a square wave form;
the load block is further configured to generate an offset voltage based on the offset current, the offset voltage having a size that is half of the step size of the staircase shape of the first voltage; and
the ramping signal is based on the first voltage and the offset voltage.

5. The system of claim 4, wherein:
a step duration of the staircase shape is substantially the same as a period of the square wave form.

6. The system of claim 1, wherein a slope of the ramping signal is adjustable based on adjusting the frequency of the first clock signal.

7. The system of claim 1, wherein each of the storage circuits includes a latch, and wherein a first latch receives the enable signal.

8. The system of claim 7, wherein the latches are gated D latches or edge triggering registers.

9. The system of claim 1, wherein each of the first current generating circuits includes one or more transistors, and a gate of one transistor is coupled to an output of the corresponding storage circuit to receive the propagated first enable signal.

10. The system of claim 9, further comprising:
one or more comparators each coupled to a column read circuit of an image sensor to receive a readout signal, wherein the comparator compares the readout signal with the ramping signal.

11. The system of claim 10, further comprising:
a counter coupled to the comparator, wherein the counter records a value corresponding to the ramping signal when the comparator switches its comparing result.

12. The system of claim 1, wherein each of the current generating circuits includes one or more transistors, and a gate of one transistor is coupled to an output of the corresponding storage circuit to receive the enable signal.

13. The system of claim 12, further comprising:
a control circuit block;
wherein:
the load block is coupled to the current generating circuits, and includes one or more resistors configured to convert the first currents and the offset current to a ramping voltage signal, and
the control circuit block is configured to control a total equivalent resistance of the one or more resistors.

14. A method for generating a ramping signal comprising:
applying an enable signal to a series of storage circuits, each of the storage circuits including an input and an output, the output of a previous storage circuit being coupled to the input of a next storage circuit;
applying a first clock signal to the series of storage circuits, wherein the first clock signal enables the series of storage circuits to propagate the enable signal through the series of storage circuits;
generating a respective first current based on the respective output of the respective storage circuit;
generating an offset current according to a second clock signal, the frequency of one of the first and second clock signals being a multiple of a frequency of the other of the first and second clock signals;
wherein the ramping signal is based on the first currents and the offset current.

15. The method of claim 14, further comprising:
generating the ramping signal based on the first currents and the offset current.

16. The method of claim 15, further comprising:
generating a first voltage based on the first currents, the first voltage having a staircase shape, the staircase shape having a step size, wherein the ramping signal is based on the first voltage and the offset current.

17. The method of claim 16, further comprising:
generating an offset voltage based on the offset current, wherein the offset current has a square wave form, the offset voltage has a size that is half of the step size of the staircase shape of the first voltage, and the ramping signal is based on the first voltage and the offset voltage.

18. The method of claim 17, wherein:
a step duration of the staircase shape is substantially the same as a period of the square wave form.

19. The method of claim 14, wherein a slope of the ramping signal is adjustable based on adjusting the frequency of the first clock signal.

20. The method of claim 14, further comprising:
comparing a readout signal of an image sensor with the ramping signal; and
recording a value corresponding to the ramping signal when a result of the comparing changes.

* * * * *